(12) United States Patent
Cho et al.

(10) Patent No.: US 9,197,209 B2
(45) Date of Patent: Nov. 24, 2015

(54) SEMICONDUCTOR DEVICE

(71) Applicant: SK hynix Inc., Icheon-si Gyeonggi-do (KR)

(72) Inventors: Oung Sic Cho, Icheon-si (KR); Sang Eun Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/307,617

(22) Filed: Jun. 18, 2014

(65) Prior Publication Data

US 2015/0280709 A1    Oct. 1, 2015

(30) Foreign Application Priority Data

Mar. 31, 2014    (KR) .................. 10-2014-0037759

(51) Int. Cl.
| | |
|---|---|
| *H03K 19/003* | (2006.01) |
| *H03K 17/16* | (2006.01) |
| *H03K 19/00* | (2006.01) |
| *H03K 3/012* | (2006.01) |
| *G05F 1/652* | (2006.01) |

(52) U.S. Cl.
CPC ............ *H03K 19/0005* (2013.01); *G05F 1/652* (2013.01); *H03K 3/012* (2013.01)

(58) Field of Classification Search
CPC ............ H04L 25/0278; H04L 25/0298; H04L 25/028; H03K 19/0005; G03F 13/4086
See application file for complete search history.

(56) References Cited

U.S. PATENT DOCUMENTS

| | | | | |
|---|---|---|---|---|
| 6,980,020 | B2* | 12/2005 | Best et al. .................. | 326/30 |
| 7,269,043 | B2* | 9/2007 | Lee .............................. | 365/63 |
| 7,295,033 | B2* | 11/2007 | Chung et al. ................ | 326/30 |
| 7,439,760 | B2* | 10/2008 | Nguyen ....................... | 326/30 |
| 7,994,813 | B2* | 8/2011 | Sohn et al. .................. | 326/30 |
| 8,598,905 | B2* | 12/2013 | Oh .............................. | 326/30 |
| 8,878,564 | B2* | 11/2014 | Araki .......................... | 326/30 |
| 2013/0182513 | A1 | 7/2013 | Eom et al. | |

FOREIGN PATENT DOCUMENTS

KR    1020130083766 A    7/2013

* cited by examiner

*Primary Examiner* — Vibol Tan
(74) *Attorney, Agent, or Firm* — William Park & Associates Ltd.

(57) ABSTRACT

The semiconductor device includes: a first die configured to include a first input pad and a first output pad; and a second die configured to include a second input pad and a second output pad. The second die corrects a level of an output voltage in response to a feedback reference voltage applied from the first output pad to the second input pad.

19 Claims, 7 Drawing Sheets

SEMICONDUCTOR DEVICE

CROSS-REFERENCE TO RELATED APPLICATION

This application claims priority based upon Korean patent application No. 10-2014-0037759, filed on Mar. 31, 2014, the disclosure of which is hereby incorporated in its entirety by reference herein.

BACKGROUND

A semiconductor device is configured to transmit/receive data and control signals to/from a memory controller through a bus. As a frequency of a signal communicated between a memory controller and a semiconductor device is gradually increased, signal distortion is also increased.

In order to prevent distortion of a signal communicated between the memory controller and the semiconductor device, termination processing is performed using a resistor or the like. If termination processing is performed, the termination resistor absorbs signal reflection, resulting in reduction of signal distortion.

SUMMARY

In accordance with an embodiment of the invention, a semiconductor device includes a first die configured to include a first input pad and a first output pad and a second die configured to include a second input pad and a second output pad. Further, the second die corrects a level of an output voltage in response to a feedback reference voltage applied from the first output pad to the second input pad.

In accordance with an embodiment of the invention, a semiconductor device includes a plurality of dies. Each die includes: an input pad configured to receive a feedback reference voltage from different dies. Each die also includes an output pad configured to output an output voltage to the different dies. Further, each die also includes an option pad configured to receive an option pad signal. Levels of the output voltages dies are corrected according to a first reference voltage generated from each die or the feedback reference voltage.

In an embodiment, a semiconductor device includes a first die configured to receive a first correction signal to correct a level of a first output voltage. The semiconductor device may also include a second die configured to receive a second correction signal to correct a level of a second output voltage. Further, the semiconductor device may also include a system on chip (SOC) configured to perform a level matching of the first output voltage and the second output voltage in response to the first correction signal or the second correction signal.

DETAILED DESCRIPTION

Reference will now be made in detail to the embodiments of the invention, examples of which are illustrated in the accompanying figures. Wherever possible, the same reference numbers will be used throughout the figures to refer to the same or like parts. Embodiments of the invention relate to a semiconductor device, and more particularly to a technology for matching different output levels of individual dies. Embodiments of the invention relate to a technology to match different output voltage levels according to characteristics of each die through an output voltage feedback among individual dies on the condition that at least two ranks are configured. An On Die Termination (ODT) device installed inside of the semiconductor chip has been mainly used in recent years. The ODT device includes a switching circuit to control a current flowing in ODT through an on/off operation, such that power consumption of the ODT device is less than the termination resistor installed outside of the semiconductor chip. However, resistance of the ODT device is changed according to a change in process, voltage, and/or temperature (PVT), such that individual dies are designed to have different output voltages (VOH). Accordingly, there is needed a process to match a level of an output voltage VOH by correcting a reference voltage in response to characteristics of each die.

Figure 1:
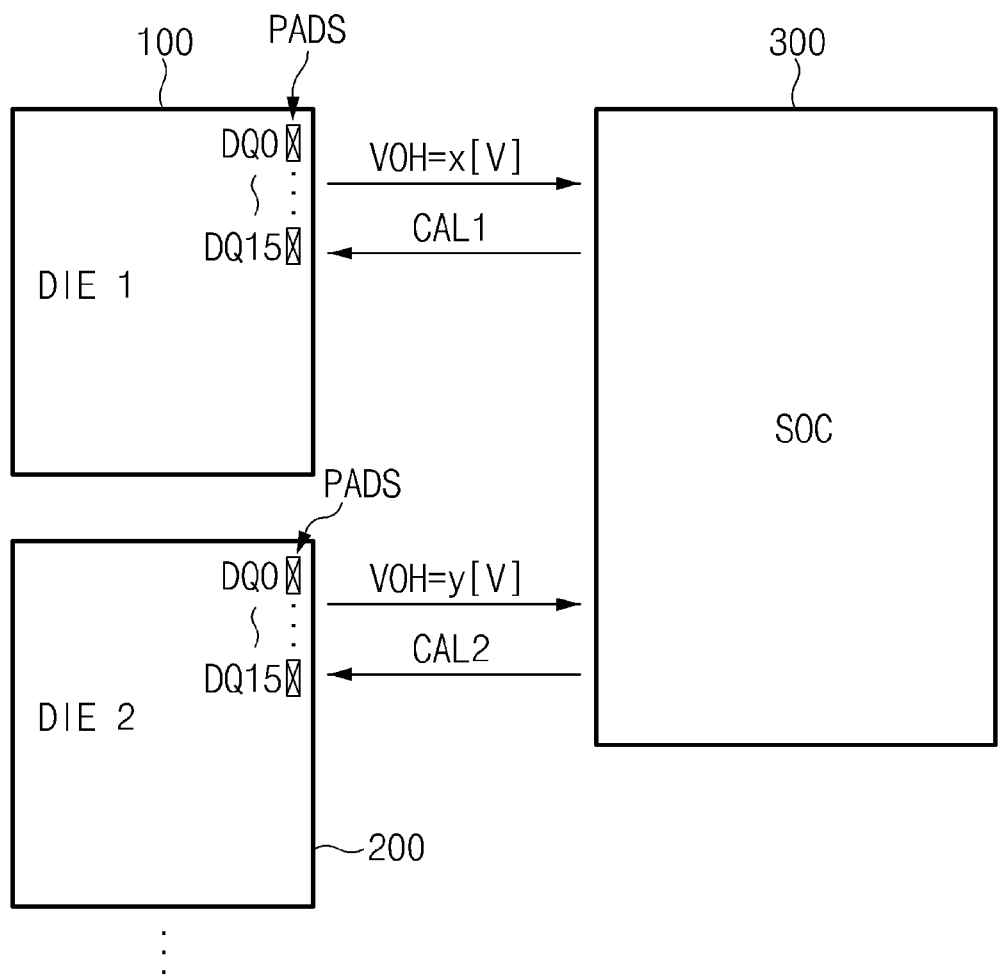
FIG. 1 is a block diagram illustrating a semiconductor device according to an embodiment.

Referring to FIG. 1, the semiconductor device according to an embodiment includes a plurality of dies (100, 200) and a System On Chip (SOC) 300.

Each die 100 or 200 may include a plurality of pads (PADS) configured to input/output data (DQ0~DQ15) to/from an external SOC 300. Although an embodiment has disclosed that 16 data pieces are input/output to/from each die (100 or 200), the number of I/O data pieces is not limited. In addition, the number of I/O data pieces can also be changed to another number as necessary without departing from the scope of the invention. Further, although an embodiment of FIG. 1 has exemplarily disclosed two dies (100, 200) for convenience of description, the number of dies is not limited, and can also be changed as necessary.

The die 100 receives a correction signal CAL1 from the SOC 300 to operate a correction circuit. The die 100 also corrects a level of the output voltage VOH. The output voltage VOH of the die 100 may be denoted by "x[V]."

The die 200 receives a correction signal CAL2 from the SOC 300 to operate a correction circuit. The die 200 also corrects a level of the output voltage VOH. The output voltage of the die 200 may be denoted by "y[V]."

If two ranks are configured in a package, output voltages VOH of individual dies (100, 200) may be mismatched as a result. Accordingly, it is necessary for the SOC 300 to perform level matching of the output voltage VOH according to a separate correction signal (CAL1 or CAL2).

The output voltage VOH of the die 100 may be mismatched to the output voltage VOH of the die 200. The SOC 300 detects a level of the output voltage VOH from each die (100 or 200), to generate a separate correction command signal through which the output voltage VOH of the die 200 can be identical to the output voltage VOH of the other die 100. The SOC 300 is also configured to repeatedly perform this correction action until the output voltage VOH(x[V]) of the die 100 is identical to the output voltage (y[V]) of the die 200.

However, if the output voltage (VOH) is changed in level, a setting value of each die (100 or 200) should be changed to another value. As a result, different output voltages (VOH) of the individual dies (100, 200) can be matched to each other through a feedback voltage between the dies (100, 200). In this instance, a delay element caused by a training action can be removed at a system level.

Figure 2:
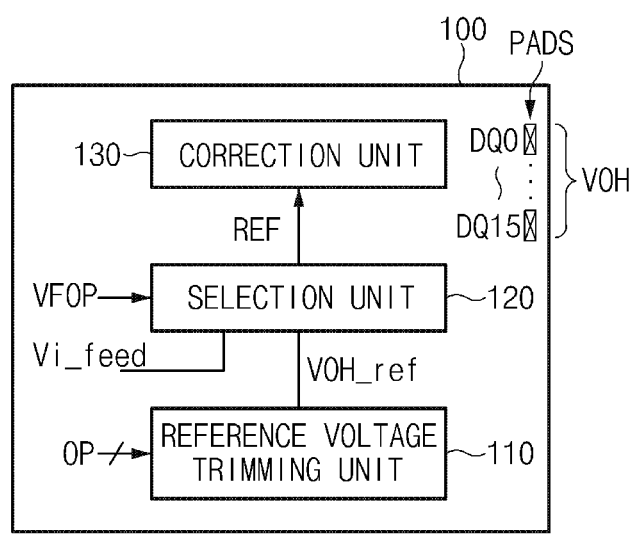
FIG. 2 is a detailed block diagram illustrating a die of FIG. 1.

Referring to FIG. 2, a detailed block diagram illustrating the die 100 shown in FIG. 1 is shown. Since the individual dies (100, 200) are identical in structure, only one die 100 will hereinafter be described in detail with reference to FIG. 2.

The die 100 includes a reference voltage trimming unit 100, a selection unit 120, and a correction unit 130. The reference voltage trimming unit 100 may perform trimming of a reference voltage (VOH_ref) level. The reference voltage trimming unit 100 may also output the trimmed reference voltage (VOH_ref) level to the selection unit 120.

In addition, the selection unit 120 may select a reference voltage in response to an option pad signal (VFOP). More specifically, the selection unit 120 may select either a reference voltage (VOH_ref) received from the reference voltage trimming unit 110 or a feedback reference signal (Vi_feed) in response to a state of the option pad signal (VFOP). The selection unit 120 may also output the selected voltage as a reference voltage (REF).

For example, the selection unit 120 selects a feedback reference voltage (Vi_feed) received from an external part when the option pad signal (VFOP) is at a logic low level. As a result, the selection unit 120 outputs the selected feedback reference voltage (Vi_feed) as a reference voltage (REF). In contrast, the selection unit 120 selects a reference voltage (VOH_ref) generated from the reference voltage trimming unit 110 of the corresponding die 100 when the option pad signal (VFOP) is at a logic high level or at a floating state. Accordingly, the selection unit 120 then outputs the selected reference voltage (VOH_ref) as a reference voltage (REF).

The correction unit 130 operates a correction circuit in response to the reference voltage (REF) received from the selection unit 120 so that the correction unit 130 corrects a level of the output voltage (VOH). The reference voltage (VOH_ref) may be differently established according to characteristics of the individual dies (100, 200). Therefore, the semiconductor device according to an embodiment applies different reference voltages (VOH_ref) to individual dies to correct a level of the output voltage (VOH).

Figure 3:
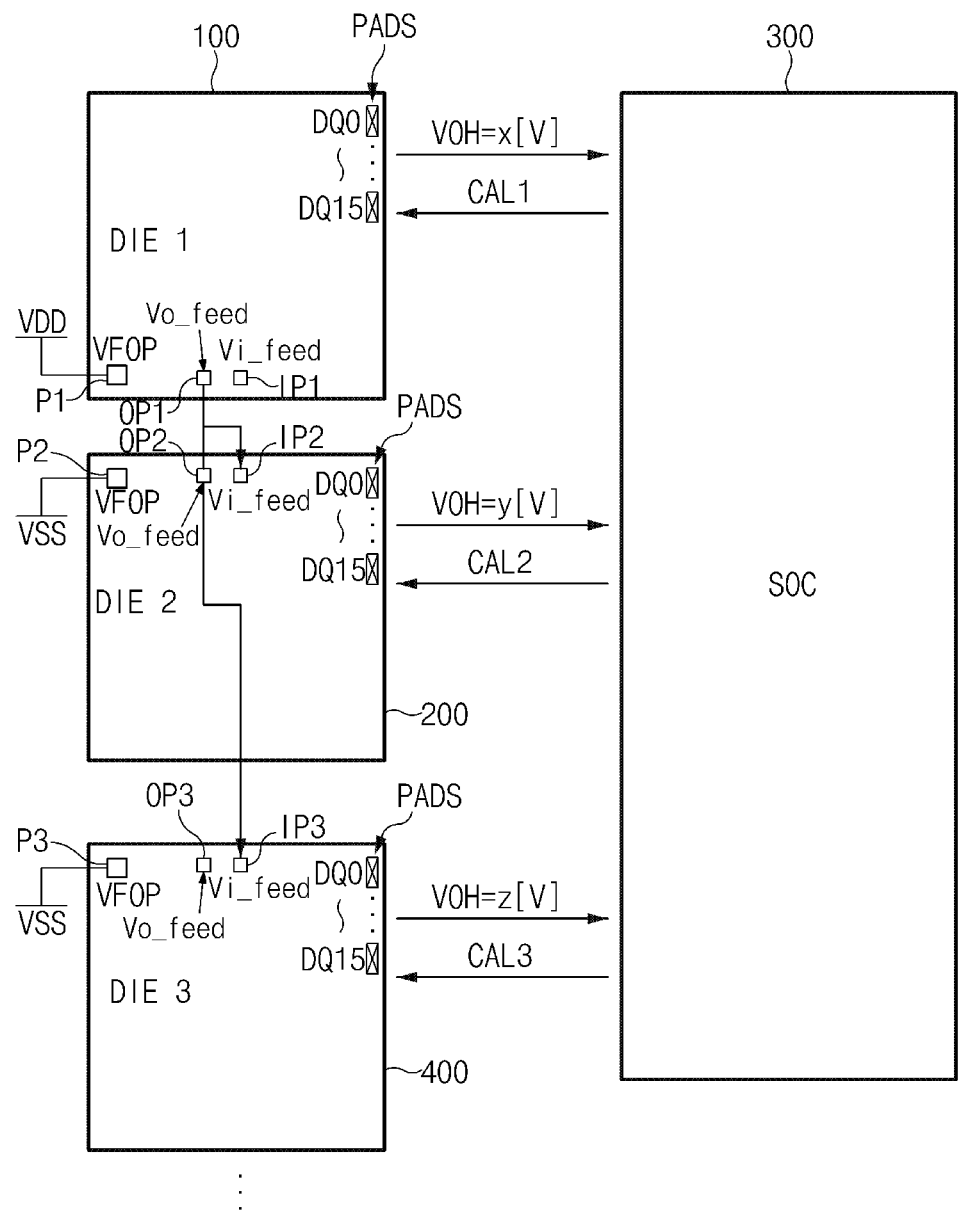
FIG. 3 is a block diagram illustrating a semiconductor device according to an embodiment.

Referring to FIG. 3, the semiconductor device includes one SOC 300 and three dies 100 electrically coupled to the SOC 300.

The semiconductor device shown in FIG. 3 includes a plurality of dies (100, 200, 400) and the SOC 300. Here, each die (100, 200 or 400) includes a plurality of pads (PADS) to input or output data (DQ0~DQ15) to/from an external SOC 300.

The die 100 receives a correction signal (CAL1) from the SOC 300. The die 100 also operates the correction circuit using this correction signal (CAL1), and corrects the output voltage (VOH) level. The output voltage (VOH) from each die 100 may be denoted by "x[V]."

The die 200 receives a correction signal (CAL2) from the SOC 300. The die 200 also operates the correction circuit using the correction signal (CAL2), and corrects a level of the output voltage (VOH). The output voltage (VOH) of the die 200 may be denoted by "y[V]."

In addition, the die 400 receives a correction signal (CAL3) from the SOC 300. Further, the die 400 also operates the correction circuit using the correction signal (CAL3), and corrects a level of the output voltage (VOH). The output voltage (VOH) of the die 400 may be denoted by "z[V]."

The die 100 includes an option pad P1, an input pad IP1, and an output pad OP1. Similarly, the die 200 includes an option pad P2, an input pad IP2, and an output pad OP2. Further, the die 400 includes an option pad P3, an input pad IP3, and an output pad OP3.

In accordance with an embodiment, the dies (100, 200, 400) are configured to input/output the output voltage (VOH) through the input pads (IP1~IP3) and the output pads (OP1~OP3). As a result, the resultant voltage may be used as a reference voltage to coordinate the mismatching of each die.

More specifically, the output voltage (Vo_feed) from the output pad OP1 of the die 100 is input to the input pad IP2 of the die 200 so that the resultant output voltage (Vo_feed) may be used as a feedback reference voltage (Vi_feed). The output voltage (Vo_feed) from the output pad OP2 of the die 200 is input to the input pad IP3 of the die 400 so that the resultant output voltage (Vo_feed) may be used as a feedback reference voltage (Vi_feed).

In contrast, the output voltage (Vo_feed) from the output pad OP3 of the die 400 is input to the input pad IP2 of the die 200 to allow the resultant output voltage (Vo_feed) to be used as a feedback reference voltage (Vi_feed). The output voltage (Vo_feed) from the output pad OP2 of the die 200 is input to the input pad IP1 of the die 100 to allow the resultant output voltage (Vo_feed) to be used as a feedback reference voltage (Vi_feed).

The dies 100, 200, and 400 may include option pads P1, P2, and P3 to receive an option pad signal (VFOP), respectively. The selection unit 120 of each die (100, 200, or 400) may determine whether to select the feedback reference voltage (Vi_feed) received from a different external die according to a state of the option pad signal (VFOP) received from each option pad (P1, P2 or P3).

The reference voltage (VOH_ref) may have different levels according to characteristics of individual dies (100, 200). As a result, different reference voltages (VOH_ref) depending upon characteristics of the individual dies may be applied to the semiconductor device of an embodiment. In the alternative, a correction action may be performed in response to the feedback reference voltage (Vi_feed) generated from different dies. Accordingly, different output voltages (VOH) of the individual dies are corrected in level so that the different output voltages (VOH) of the individual dies can be matched to each other. FIG. 3 also illustrates a power supply voltage VDD.

Figure 4:
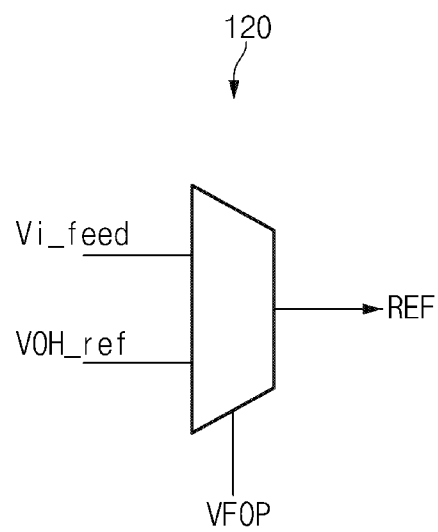
FIG. 4 is a detailed block diagram illustrating a selection unit of FIG. 2.

Referring to FIG. 4, a detailed block diagram illustrating the selection unit 120 of FIG. 2 is shown. The selection unit 120 may select a feedback reference voltage (Vi_feed) received from an external die in response to a state of the option pad signal (VFOP) received from the option pads (P1~P3). Alternatively, the selection unit 120 may select a reference voltage (VOH_ref) received from the corresponding die such that the selected voltage may be output as a reference voltage (REF). In this instance, the selection unit 120 may include a multiplexer that selects one of two signals in response to the option pad signal (VFOP) and outputs the selected signal as a reference voltage (REF).

For example, a method for operating the semiconductor device using the selection unit 120 of the second die 200 as a reference will be described.

If the option pad signal (VFOP) from the option pad P2 is at a logic low level, the selection unit 120 selects a feedback reference voltage (Vi_feed) transferred from the output pad OP1 of the first die 100 to the input pad IP2. The selection unit 120 also outputs the selected feedback reference voltage (Vi_feed) as a reference voltage (REF).

In the alternative, if the option pad signal (VFOP) from the option pad P2 is at a logic high level or at a floating state, the selection unit 120 selects a reference voltage (VOH_ref) generated from the reference voltage trimming unit 110 of the corresponding die 200. In addition, the selection unit 120 also outputs the selected reference voltage (VOH_ref) as a reference voltage (REF).

Figure 5:
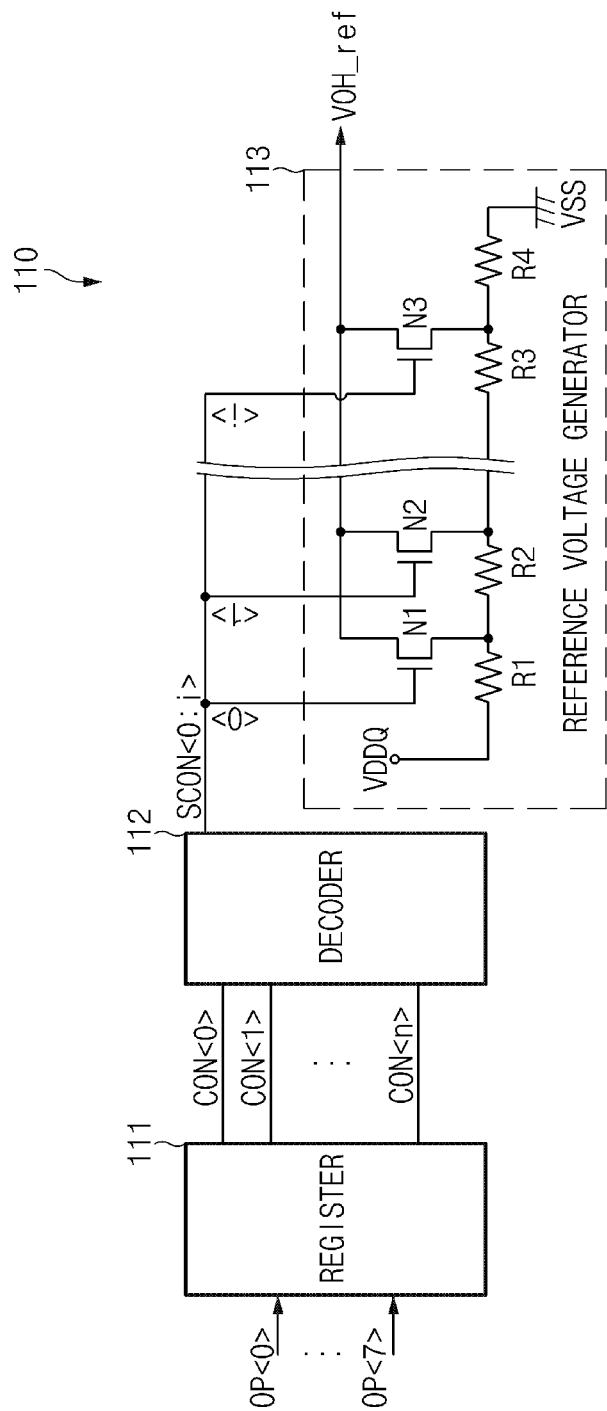
FIG. 5 is a detailed block diagram illustrating a reference voltage trimming unit of FIG. 2.

Referring to FIG. 5, a detailed block diagram illustrating the reference voltage trimming unit 110 of FIG. 2 is shown.

The reference voltage trimming unit 110 may include a register 111, a decoder 112, and a reference voltage generator 113.

The register 111 may output a plurality of control signals (CON<0> to CON<n>) to control an On Die Termination (ODT) state signal value in response to a plurality of pad signals (OP<0> to OP<7>). The register 111 may include a Mode Register Write register. The ODT state signal value stored in the register 111 may be updated by a user.

The decoder 112 decodes a plurality of control signals (CON<0:n>) to allow the decoder 112 to output a plurality of switching control signals (SCON<0:i>). The decoder 112 may selectively control an activation state of the plural switching control signals (SCON<0:i>) in response to a test signal.

Further, the reference voltage generator 113 may include a plurality of switching elements and a plurality of resistors (R1~R4). The switching element may include a plurality of NMOS transistors (N1~N3).

The NMOS transistors (N1~N3) are electrically coupled in parallel between an output terminal of the reference voltage (VOH_ref) and connection nodes of the resistors (R1~R4) so that the NMOS transistors (N1~N3) may receive the switching control signal (SCON) through their gate terminals. The resistors (R1~R4) are electrically coupled in series between an input terminal of a power-supply voltage (VDDQ) and an input terminal of a ground voltage (VSS) to allow a voltage level of the reference voltage (VOH_ref) to be distributed through the resistors (R1~R4).

In the case of the reference voltage generator 113, the number of NMOS transistors (N1~N3) turned on in response to the switching control signal (SCON) may be coordinated (or adjusted) during the test operation mode. Accordingly, a distribution rate of the resistors (R1~R4) is coordinated (or adjusted) to allow the reference voltage (VOH_ref) level to be trimmed.

Figure 6:
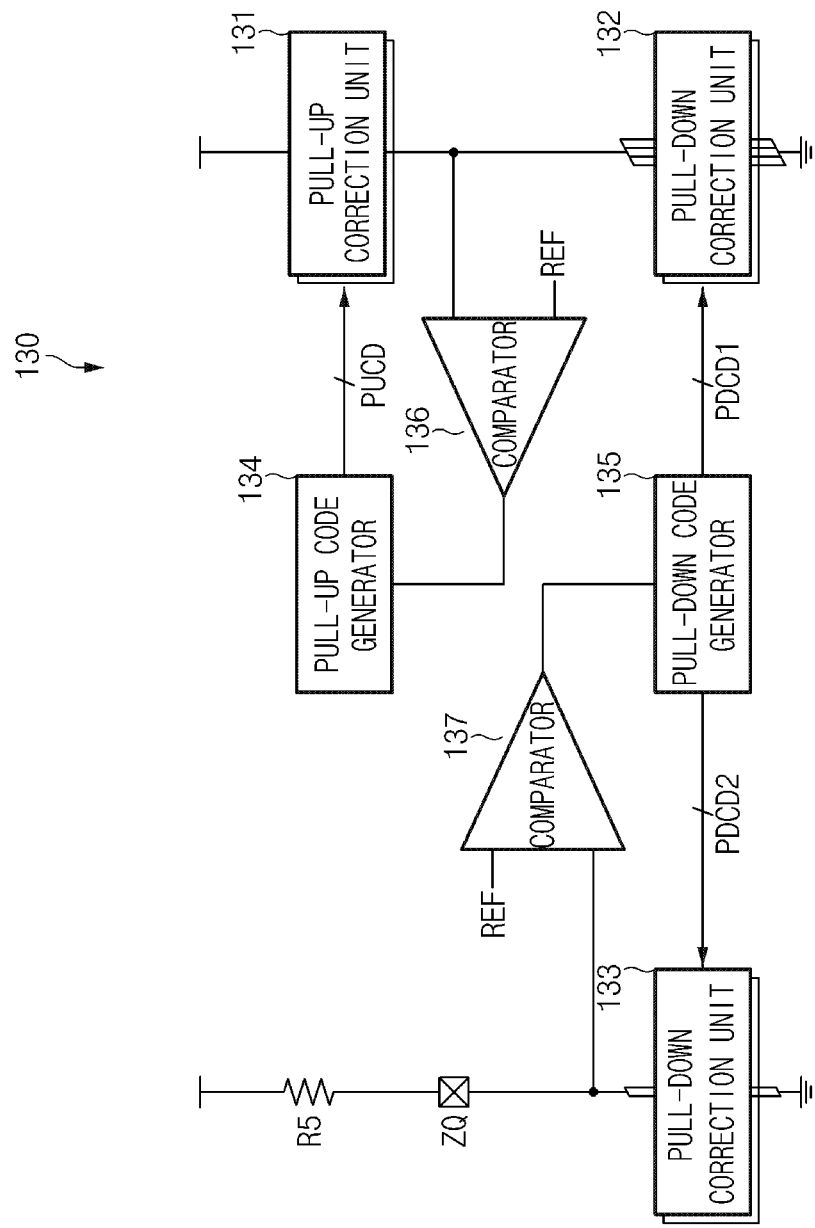
FIG. 6 is a detailed block diagram illustrating a correction unit of FIG. 2.

Referring to FIG. 6, a detailed block diagram illustrating the correction unit 130 of FIG. 2 is shown.

The correction unit 130 includes a resistor R5, a pad ZQ, pull-up correction unit 131, a pull-down correction unit 132, a pull-down correction unit 133, a pull-up code generator 134, a pull-down code generator 135, and comparators (136, 137).

The pad ZQ may be electrically coupled to a termination resistor R5 to control a termination action. Although the resistor R5 is located outside of the semiconductor device as shown in FIG. 6, the resistor R5 may also be located inside of the semiconductor device as necessary.

The pull-up correction unit 131 coordinates a pull-up voltage of the output terminal to coordinate the output voltage (VOH) level. The pull-up correction unit 131 may include a PMOS transistor, an NMOS transistor or a resistor. The pull-up correction unit 131 may also be turned on in response to a pull-up code (PUCD).

The pull-down correction unit 132 coordinates a pull-down voltage of the output terminal to coordinate a level of the output voltage (VOH). The pull-down correction unit 132 may include a PMOS transistor, an NMOS transistor or a resistor. The pull-down correction unit 132 may be turned on in response to a pull-down code (PDCD1).

The pull-down correction unit 133 may have the same circuit as in the pull-down correction unit 132. The pull-down correction unit 133 may be turned on in response to a pull-down code (PDCD2). The pull-down correction unit 133 may correct a pull-down voltage of the pad ZQ.

The pull-down correction unit 132 is electrically coupled to the pull-up correction unit 131. The pull-down correction unit may be electrically coupled to the pad ZQ.

The comparator 136 compares a reference voltage (REF) with a voltage of each connection node of the pull-up correction unit 131 and the pull-down correction unit 132. The comparator 136 also outputs the result of comparison to the pull-up code generator 134. In addition, the comparator 137 compares the reference voltage (REF) with a voltage of a connection node between the pad ZQ and the pull-down correction unit 133. The comparator also outputs the result of comparison to the pull-down code generator 135.

In this instance, the reference voltage (REF) may be any one of the feedback reference voltage (Vi_feed) used as a feedback input from another die or the reference voltage (VOH_ref) generated from the reference voltage trimming unit 110.

More specifically, if the option pad signal (VFOP) received from the option pad (e.g., option pad P2) is at a logic low level during the test mode, the reference voltage (REF) level is coordinated (or adjusted) using the feedback reference voltage (Vi_feed) used as a feedback input from another die. As a result, a level of the output voltage (VOH) generated from the correction unit 130 can then be matched to an output voltage (VOH) level of another die.

The pull-code generator 134 generates a pull-up code (PUCD) in response to an output signal of the comparator 136. The pull-code generator 134 also outputs the pull-up code (PUCD) to the pull-up correction unit 131. The pull-down code generator 135 may generate pull-down codes (PDCD1, PDCD2) in response to an output signal of the comparator 137. The pull-down code generator 135 may also respectively output the pull-down codes (PDCD1, PDCD2) to the pull-down correction units (132, 133). In this instance, the pull-down code generator 135 may output the pull-down code (PDCD1) to the pull-down correction unit 132. The pull-down code generator 135 may also output the pull-down code (PDCD2) to the pull-down correction unit 133.

The above-mentioned correction unit 130 may enable the comparators (135, 136) to repeatedly compare the reference voltage (REF) with a voltage of each termination node. As a result, a resistance value of the pull-up correction unit 131 and resistance values of the pull-down correction units (132, 133) are coordinated. Accordingly, a level of the output voltage (VOH) generated from the semiconductor device can be coordinated.

Figure 7:
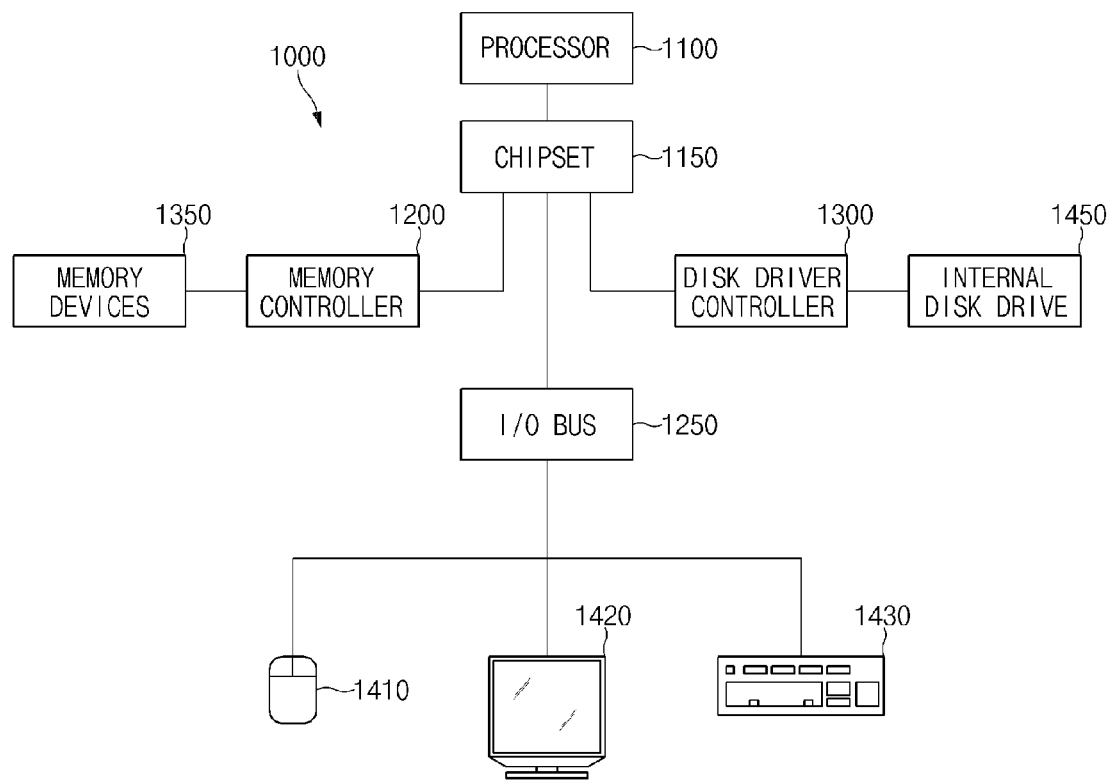
FIG. 7 illustrates a block diagram of a system employing a memory controller circuit in accordance with an embodiment of the invention.

Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above description, the semiconductor device according to an embodiment can match different output voltage levels according to characteristics of each die through an output voltage feedback among individual dies on the condition that at least two ranks are configured.

Those skilled in the art will appreciate that the invention may be carried out in other specific ways than those set forth without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. Also, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the figures and the accompanying claims. In addition to variations and modifications in the component parts and/or arrangements, alternative uses will also be apparent to those skilled in the art.

What is claimed is:

1. A semiconductor device comprising:
   a first die configured to include a first input pad and a first output pad; and
   a second die configured to include a second input pad and a second output pad,
   wherein the second die corrects a level of an output voltage in response to a feedback reference voltage applied from the first output pad to the second input pad,
   wherein the correction of the output voltage is performed until the output voltage level of the first die is matched to the output voltage level of the second die.

2. The semiconductor device according to claim 1, wherein the second die includes:
   a reference voltage trimming unit configured to trim a first reference voltage according to a pad signal;
   a selection unit configured to select any one of the first reference voltage and the feedback reference voltage according to an option pad signal, and output the selected reference voltage as a second reference voltage; and
   a correction unit configured to correct a level of the output voltage according to the second reference voltage.

3. The semiconductor device according to claim 2, wherein the reference voltage trimming unit includes:
   a register configured to output a plurality of control signals to control an On Die Termination (ODT) state signal value in response to the pad signal;
   a decoder configured to generate a switching control signal by decoding the plurality of control signals; and
   a reference voltage generator configured to generate the first reference voltage according to the switching control signal.

4. The semiconductor device according to claim 3, wherein the register includes a mode register write register.

5. The semiconductor device according to claim 3, wherein the reference voltage generator coordinates the number of switching elements turned on according to the switching control signal, and generates the first reference voltage obtained by resistance coordination.

6. The semiconductor device according to claim 2, wherein the second die further includes an option pad to receive the option pad signal as an input.

7. The semiconductor device according to claim 2, wherein the selection unit selects the first reference voltage when the option pad signal is at a first logic level or a floating level, and selects the feedback reference voltage when the option pad signal is at a second logic level.

8. The semiconductor device according to claim 2, wherein the correction unit includes:
   a pull-up correction unit configured to correct a level of the output voltage by coordinating a pull-up voltage of an output terminal according to a pull-up code;
   a first pull-down correction unit configured to coordinate a level of the output voltage by coordinating a pull-down voltage of the output terminal according to a first pull-down code;
   a second pull-down correction unit configured to coordinate a voltage of a termination pad according to a second pull-down code;
   a first comparator configured to compare a voltage of the output terminal with the second reference voltage;
   a second comparator configured to compare a voltage of the termination pad with the second reference voltage;
   a pull-up code generator configured to generate the pull-up code according to an output signal of the first comparator; and
   a pull-down generator configured to generate the first pull-down code and the second pull-down code according to an output signal of the second comparator.

9. A semiconductor device comprising:
   a plurality of dies,
   wherein each die comprises:
      an input pad configured to receive a feedback reference voltage from different dies;
      an output pad configured to output an output voltage to the different dies; and
      an option pad configured to receive an option pad signal,
      wherein levels of the output voltages are corrected according to a first reference voltage generated from each die or the feedback reference voltage.

10. The semiconductor device according to claim 9, wherein each of the plurality of dies includes:
   a reference voltage trimming unit configured to trim the first reference voltage according to a pad signal;

a selection unit configured to select any one of the first reference voltage and the feedback reference voltage according to the option pad signal, and output the selected reference voltage as a second reference voltage; and a correction unit configured to correct a level of the output voltage according to the second reference voltage.

11. The semiconductor device according to claim 10, wherein the reference voltage trimming unit includes:
   a register configured to output a plurality of control signals to control an On Die Termination (ODT) state signal value in response to the pad signal;
   a decoder configured to generate a switching control signal by decoding the plurality of control signals; and
   a reference voltage generator configured to generate the first reference voltage in response to the switching control signal.

12. The semiconductor device according to claim 11, wherein the register includes a mode register write register.

13. The semiconductor device according to claim 11, wherein the reference voltage generator coordinates the number of switching elements turned on according to the switching control signal, and generates the first reference voltage obtained by resistance coordination.

14. The semiconductor device according to claim 10, wherein the selection unit selects the first reference voltage when the option pad signal is at a first logic level or a floating level, and selects the feedback reference voltage when the option pad signal is at a second logic level.

15. The semiconductor device according to claim 10, wherein the correction unit includes:
   a pull-up correction unit configured to correct a level of the output voltage by coordinating a pull-up voltage of an output terminal according to a pull-up code;
   a first pull-down correction unit configured to coordinate a level of the output voltage by coordinating a pull-down voltage of the output terminal according to a first pull-down code;
   a second pull-down correction unit configured to coordinate a voltage of a termination pad according to a second pull-down code;
   a first comparator configured to compare a voltage of the output terminal with the second reference voltage;
   a second comparator configured to compare a voltage of the termination pad with the second reference voltage;
   a pull-up code generator configured to generate the pull-up code in response to an output signal of the first comparator; and
   a pull-down generator configured to generate the first pull-down code and the second pull-down code in response to an output signal of the second comparator.

16. The semiconductor device according to claim 9, wherein the correction of the output voltage is performed until levels of the output voltages of the plurality of dies are matched.

17. A semiconductor device comprising:
   a first die configured to receive a first correction signal to correct a level of a first output voltage;
   a second die configured to receive a second correction signal to correct a level of a second output voltage, and
   a system on chip (SOC) configured to perform a level matching of the first output voltage and the second output voltage in response to the first correction signal or the second correction signal.

18. The semiconductor device according to claim 17, wherein the SOC is configured to detect the level of the first output voltage and the level of the second output voltage to generate a correction command signal to match the first output voltage to the second output voltage.

19. The semiconductor device according to claim 17, wherein the first die comprises:
   a correction unit configured to operate a correction circuit according to a reference voltage and correct the level of the first output voltage.

* * * * *